US008330238B2

(12) United States Patent
van Wingerden et al.

(10) Patent No.: US 8,330,238 B2
(45) Date of Patent: Dec. 11, 2012

(54) MICROSCOPIC STRUCTURE PACKAGING METHOD AND DEVICE WITH PACKAGED MICROSCOPIC STRUCTURE

(75) Inventors: Johannes van Wingerden, Hardinxveld-Giessendam (NL); Wim van den Einden, Deurne (NL); Harold H. Roosen, Eindhoven (NL); Greja Johanna Adriana Maria Verheijden, Reithoven (NL); Gerhard Koops, Aalst (BE); Didem Ernur, Kessel-Lo/Leuven (BE); Jozef Thomas Martinus van Beek, Rosmalen (NL)

(73) Assignee: NXP B.V., Eindhoven (NL)

( * ) Notice: Subject to any disclaimer, the term of this patent is extended or adjusted under 35 U.S.C. 154(b) by 289 days.

(21) Appl. No.: 12/953,092

(22) Filed: Nov. 23, 2010

(65) Prior Publication Data

US 2011/0175178 A1 Jul. 21, 2011

(30) Foreign Application Priority Data

Nov. 24, 2009 (EP) ..................................... 09176943

(51) Int. Cl.
H01L 29/84 (2006.01)

(52) U.S. Cl. ................. 257/415; 257/417; 257/E29.324; 257/E21.502; 438/51

(58) Field of Classification Search .................. 257/415, 257/417, E29.324, E21.502; 438/51
See application file for complete search history.

(56) References Cited

U.S. PATENT DOCUMENTS

| 7,803,665 B2* | 9/2010 | Witvrouw et al. ............. 438/124 |
| 8,273,653 B2* | 9/2012 | Verheijden et al. ............ 438/626 |
| 2009/0267166 A1 | 10/2009 | Verheijden et al. |
| 2010/0006957 A1 | 1/2010 | Verheijden et al. |
| 2011/0109405 A1* | 5/2011 | Buchwalter et al. .......... 333/187 |

FOREIGN PATENT DOCUMENTS

GB 2 373 367 A 9/2002

OTHER PUBLICATIONS

He, R. et al. "On-Wafer Monolithic Encapsulation by Surface Micromachining with Porous Polysilicon Shell," J. of Microelectromechanical Systems, vol. 16, No. 2, pp. 462-472 (Apr. 2007).
Joseph, P., et al. "Wafer-Level Packaging of Micromechanical Resonators," IEEE Trans. on Advanced Packaging, vol. 30, No. 1, pp. 19-26 (Feb. 2007).
Verheijden, G. et al. "Wafer Level Encapsulation Technology for MEMS Devices Using an HF-Permeable PECVD SIOC Capping Layer," IEEE MEMS Conf., pp. 798- 801. (Jan. 13, 2008).
He, R. et al. "Low-Temperature Monolithic Encapsulation Using Porous-Alumina Shell Anodized on Chip," J. of Microelectromechanical Systems, vol. 18, No. 3, pp. 588-596 (Jun. 2009).
He, R. et al. "On-Wafer Monolithic Encapsulation by Surface Micromachining With Porous Polysilicon Shell," J. of Microelectromechanical Systems, vol. 16, No. 2, pp. 462-472, (Apr. 2007).
Extended European Search Report for European Patent Appln. No. 09176943.0 (May 17, 2010).

* cited by examiner

*Primary Examiner* — Trung Q Dang

(57) ABSTRACT

A method of packaging a micro electro-mechanical structure comprises forming said structure on a substrate; depositing a sacrificial layer over said structure; patterning the sacrificial layer; depositing a SIPOS (semi-insulating polycrystalline silicon) layer over the patterned sacrificial layer; treating the SIPOS layer with an etchant to convert the SIPOS layer into a porous SIPOS layer, removing the patterned sacrificial layer through the porous layer SIPOS to form a cavity including said structure; and sealing the porous SIPOS layer. A device including such a packaged micro electro-mechanical structure is also disclosed.

14 Claims, 4 Drawing Sheets

MICROSCOPIC STRUCTURE PACKAGING METHOD AND DEVICE WITH PACKAGED MICROSCOPIC STRUCTURE

This application claims the priority under 35 U.S.C. §119 of European patent application no. 09176943.0, filed on Nov. 24, 2009, the contents of which are incorporated by reference herein.

FIELD OF THE INVENTION

The present invention relates to a method of packaging a microscopic structure. The present invention further related to a device comprising such a microscopic structure.

BACKGROUND OF THE INVENTION

The ongoing miniaturization of feature sizes in semiconductor manufacturing processes has facilitated the formation of microscopic structures, i.e. structures that have feature sizes in the micron and submicron, e.g. nanometer domain, on substrates such as silicon substrates. A prime example of such a microscopic structure is a microelectromechanical system (MEMS) structure. Such structures are sometimes also referred to as micromachines.

MEMS structures can be used for a wide range of applications in different fields of technology, e.g. electronics, medicine, pharmacy and chemistry. Applications in the filed of electronics for instance include accelerometers, gyroscopes, sensors, and so on. The MEMS structures may be made from any suitable material, e.g. silicon, polymer, metals amongst others.

Typically, the MEMS structure requires a certain degree of translational freedom in order to perform its function. To this end, the MEMS structure is packaged such that the structure is located in a sealed cavity.

FIG. 1 shows a process flow of a typical state of the art MEMS structure manufacturing process including a packaging step. In step (a), a silicon substrate 10 carrying an oxide layer 12 and a patterned silicon layer 14 including resonant structures 16 is provided. In step (b), the resonator trenches are resealed with oxide 18, which is etched to provide contact regions to the underlying silicon layer 14. In step (c), a thin (e.g. 2 micron) layer 20 of silicon is deposited over the substrate stack in which micron-scale vent holes (not shown) are etched to allow HF vapor access for release of the resonant structures 16 in step (d), in which the cavities 22 each including a resonant structure 16 are formed. In step (e), a silicon encapsulation layer 24 is deposited at 950° C. followed by a CMP planarization and etching of the encapsulation layer 24 to define the electrical contacts. In step (f), oxide 26 is deposited to seal the trenches and is etched to allow the electrical contact to the underlying encapsulation layer 24, after which aluminum contacts 28 are formed in step (g) by deposition and etching.

This process flow has several drawbacks. For instance, the etching of the micrometer sized vent holes requires an additional processing step, thus adding to the cost of the overall manufacturing process. Also, to avoid contamination of the cavity containing the MEMS structure with capping material, the vent holes should not be located directly over the cavity, thus limiting the flexibility of the manufacturing process. Moreover, relatively thick capping layers are required to effectively seal the cavity, thus further adding to the cost of the manufacturing process.

In the paper "Wafer Level Encapsulation Technology for MEMS Devices using a HF-Permeable PECVD SIOC Capping Layer" by G. J. A. M. Verheijden et al. in MEMS 2008, IEEE 21$^{st}$ conference on Micro Electro Mechanical Systems 2008, pages 798-801, an alternative technology for the encapsulation of MEMS devices using a porous capping material is disclosed, which overcomes many of the problems associated with the process of FIG. 1.

The capping material consists of a low temperature PECVD layer of SiOC (trade name Black Diamond) and is shown to be permeable to HF vapor and $H_2O$ and therefore allows for the removal of a $SiO_2$ sacrificial layer and the formation of a cavity underneath the capping layer, with the capping material being permeable enough to allow for the evacuation of the $SiO_2$ reaction products. The cavity underneath the capping layer allows for high-Q operation of a MEMS resonator. A sealing layer can be deposited on the capping layer without significantly contaminating the cavity. However, it has been found that residual contamination of the cavity is difficult to avoid, especially when a sealing layer consisting of relatively small molecules is formed. In addition, there are no suitable process steps available to seal the porous layer at high temperature and low pressure, such that it is difficult to obtain a cavity with a high quality vacuum using this method.

In R. He et al., Journal of Micro-electromechanical Systems, Vol. 16, pages 462-472 (2007), a porous polysilicon cap layer is obtained over a MEMS structure by electrochemical etching of a polysilicon layer. Sealing of this layer is performed with the deposition of a further polysilicon layer or an LPCVD silicon oxide layer. The drawback of this approach is that the electrochemical etching of the polysilicon layer to obtain the porous polysilicon cannot be readily achieved in standard manufacturing tools, thus requiring an additional investment. In addition, the packaging method proposed in this paper requires the inclusion of a critical point drying step after the cavity formation for avoiding the MEMS structures sticking to the cavity walls. Furthermore, the required background pressures of the proposed sealing techniques are such that the preferable low pressure in the packaged cavity cannot be achieved.

SUMMARY OF THE INVENTION

The present invention seeks to provide a cost-effective method of packaging a MEMS structure, preferably in a low pressure cavity on a substrate.

The present invention further seeks to provide a device comprising such a packaged MEMS structure.

In accordance with a first aspect of the present invention, there is provided a method of packaging a micro electromechanical structure comprising forming said structure on a substrate; depositing a sacrificial layer over said structure; patterning the sacrificial layer; depositing a SIPOS (semi-insulating polycrystalline silicon) layer over the patterned sacrificial layer; treating the SIPOS layer with an etchant to convert the SIPOS layer into a porous SIPOS layer; removing the patterned sacrificial layer through the porous layer SIPOS to form a cavity including said structure; and sealing the porous SIPOS layer.

The present invention is based on the realization that SIPOS is a suitable material for forming a capping layer over a MEMS cavity due to the fact that SIPOS can be made porous using suitable etchants such as HF (hydrogen fluoride) vapor, and which can be sealed at high temperatures and low pressures using standard manufacturing tools, such that a high quality vacuum cavity can be obtained at low cost compared to the prior art packaging techniques.

In an embodiment, the steps of treating the SIPOS layer and removing the patterned sacrificial layer are performed as a single step using the same etchant. This further reduces the cost and complexity of the packaging method.

In a preferred embodiment, the step of sealing the porous SIPOS layer comprises at least partially converting the porous SIPOS layer into an oxide layer, for instance by means of thermal oxidation. Because such a thermal oxidation step can be performed at high temperatures and low pressures, a good quality vacuum is established in the sealed cavity.

The method may further comprise additional processing steps such as providing a contact region in the SIPOS layer following the removal of the patterned sacrificial layer; and forming a metal contact such as an aluminum contact, in at least said contact region to provide contacts to the MEMS device.

In an alternative embodiment, the step of forming a metal contact in at least said contact region comprises depositing a metal layer over the porous SIPOS layer and patterning said metal layer to form the metal contact and a sealing layer for at least the part of said porous SIPOS layer covering the cavity.

This has the advantage of requiring one less processing step compared to the partial thermal oxidation of the SIPOS layer at the cost of a somewhat higher pressure inside the cavity.

According to another aspect of the present invention, there is provided a device comprising a substrate covered by a porous SIPOS capping layer, a cavity in between the substrate and the porous SIPOS capping layer, said cavity including a micro electro-mechanical structure; and a sealing layer covering the porous SIPOS capping layer. Such a device has the advantage of comprising a cavity having a high quality vacuum, especially if the sealing layer comprises thermally oxidized SIPOS. Preferably, the capping layer and the sealing layer are a single layer of thermally oxidized SIPOS.

Alternatively, the sealing layer (180) may comprise a metal layer such as an aluminum layer. This reduces the cost of the device at the expense of a slightly higher pressure inside the cavity.

BRIEF DESCRIPTION OF DRAWINGS

Embodiments of the invention are described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

DETAILED DESCRIPTION OF EMBODIMENTS

Figure 1:
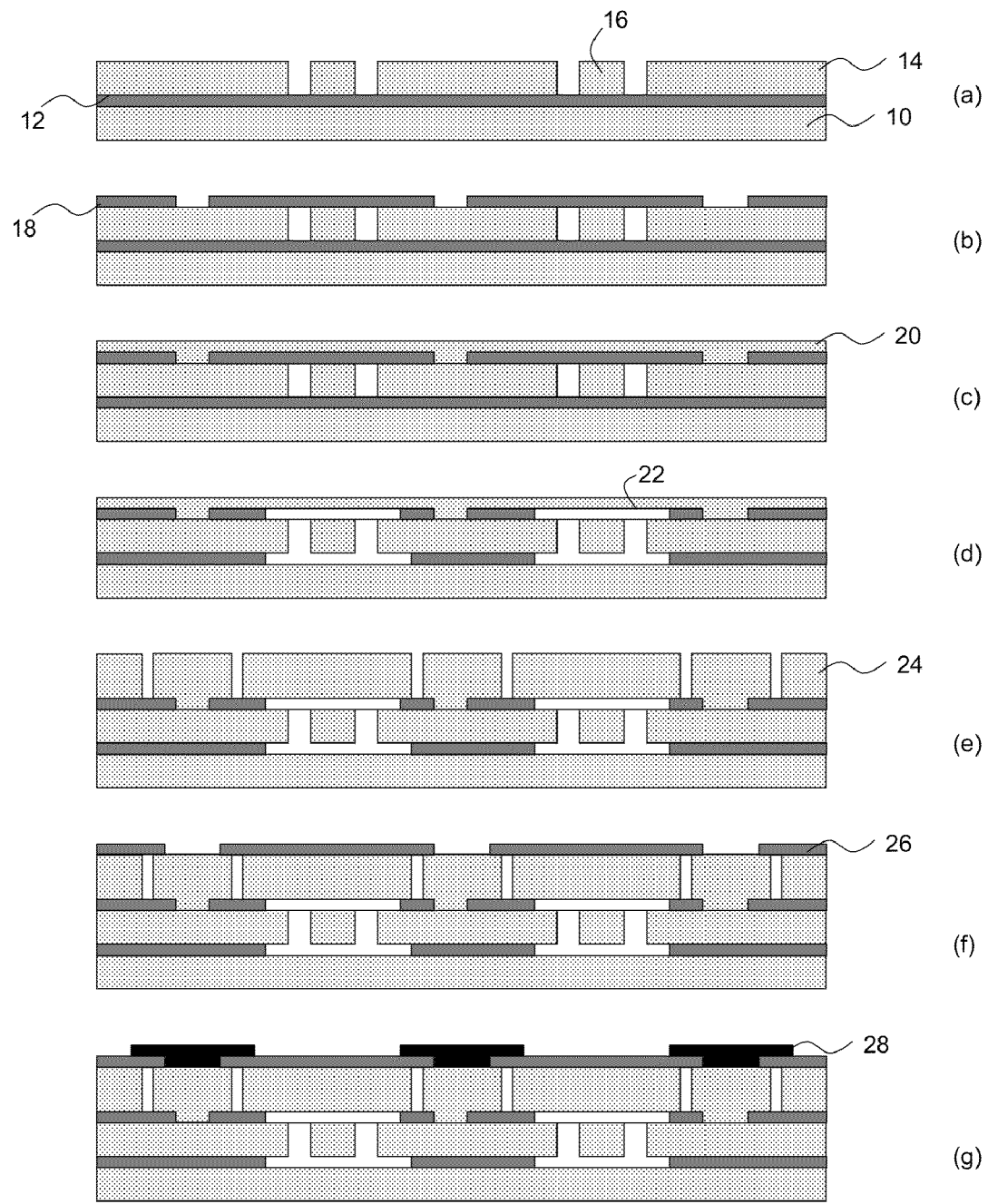
FIGS. 1a-g depict a known method of manufacturing a MEMS device.
Figure 2:
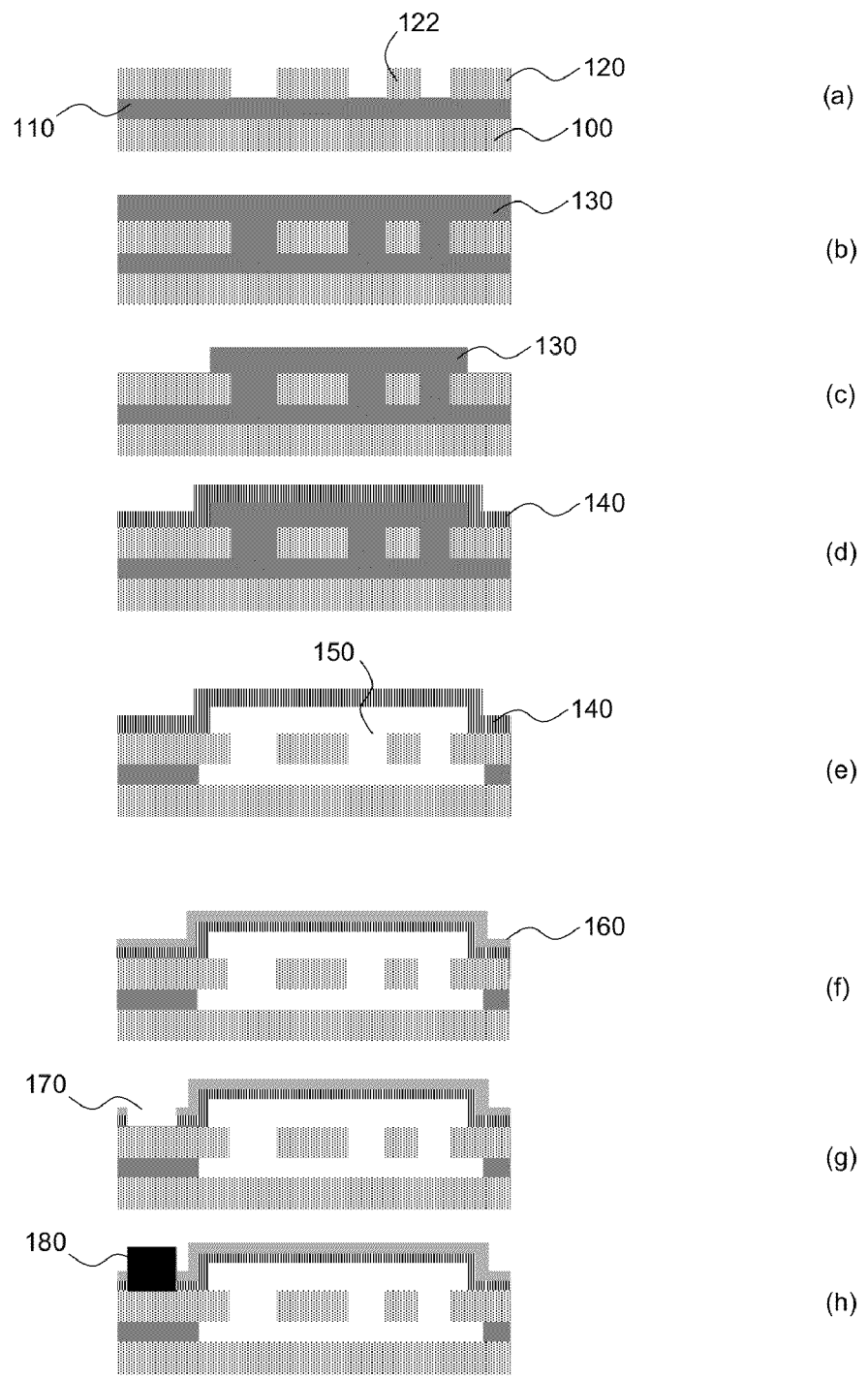
FIGS. 2a-h depict a method of manufacturing a MEMS device in accordance with an embodiment of the present invention.

A first embodiment of a packaging method of the present invention is described in more detail with the aid of FIG. 2. In FIG. 2(a), a substrate 100, which may be any suitable substrate, e.g. a silicon substrate, is provided with a first layer 110 of a sacrificial material, onto which a layer of a suitable material 120, e.g. silicon, is deposited and subsequently patterned to form the outline of MEMS structure 122, such as a MEMS resonator or another suitable MEMS device. Such processing steps are well-known to the skilled person and will not be explained in further detail for reasons of brevity only. Any suitable sacrificial material may be used. A non-limiting example of a suitable sacrificial material is TEOS (tetraethylorthosilicate).

In FIG. 2(b), a further layer 130 of the sacrificial material is deposited over the patterned material layer 120 such that the MEMS structure 122 is surrounded by the sacrificial material in the cross-section of the device shown in FIG. 2. In FIG. 2(c), the further layer 130 is patterned in any suitable manner, e.g. by etching, after which a SIPOS layer 140 is deposited over the resulting structure in FIG. 2(d). SIPOS is an oxide-rich poly-Si, which may be formed by the co-deposition of $SiO_2$ and silicon or by depositing poly-Si in a (slightly) oxidizing atmosphere.

In a next step, the SIPOS layer 140 is subjected to a treatment that renders the SIPOS layer 140 porous. In an embodiment, the SIPOS layer 140 is subjected to a HF vapor or an aqueous HF solution, although other etchants may also be feasible. The thus achieved porosity of the SIPOS layer 140 is used to remove the sacrificial material from underneath the SIPOS layer 140 to form the cavity 150 surrounding the MEMS structure 122, as shown in FIG. 2(e). The cavity formation may be achieved by a separate etching step. Preferably, a single etching step, e.g. a HF etching step is applied to make the SIPOS layer 140 porous and at least partially remove the sacrificial material layers 110 and 130.

Upon formation of the cavity 150 by the removal of the sacrificial material, e.g. TEOS, the porous SIPOS layer 140 needs to be sealed to shield the cavity from external influences that can affect the behavior of the MEMS structure 122. This typically includes setting the internal pressure of the cavity 150 during the sealing process. It is desirable that the internal pressure is as low as possible, i.e. that a high-quality vacuum is achieved in the cavity 150, as this reduces the dampening of a resonator structure, thereby improving its Q-factor. Preferably, the internal pressure is in the range of $10^{-5}$-1 Pa or lower if achievable.

This is typically governed by the processing conditions under which a capping layer, here the porous SIPOS layer 140, is sealed. For instance, a deposition technique for depositing a sealing layer may require a minimum pressure to achieve a satisfactory deposition, such that the achievable pressure inside the cavity 150 has a lower bound defined by this required minimum pressure.

In a preferred embodiment, the porous SIPOS layer 150 is at least partially oxidized in a thermal oxidation process, as shown in FIG. 2(f), in which the upper surface of the SIPOS layer 140 is converted into an oxide layer 160. Such a thermal oxidation process may comprise dry oxidation, e.g using $O_2$, or wet oxidation, e.g. using $H_2O$. Thermal oxidation has the advantage that it can be performed at a high temperature, e.g. 750-1100° C., thus achieving a high degree of outgassing of residual contamination from the cavity 150, which reduces the resultant pressure in the cavity 150 compared to the formation of sealing layers at lower temperatures, where these contaminations are less effectively removed and can subsequently increase pressure inside the cavity 150 during the lifetime of the device.

In an alternative embodiment, the porous SIPOS layer 140 is completely converted into an oxide layer by means of e.g. thermal oxidation. In some processes, this improves the quality of the seal over the cavity 150. In an embodiment, a patterned support layer may be formed prior to the deposition of the SIPOS layer to strengthen the SIPOS layer. This is especially advantageous when the SIPOS layer is completely oxidized.

The packaging method may further include post-packaging processing steps, such as the formation, e.g. etching, of a contact region 170 for the MEMS structure 122 through the sealing layer 160 and the (porous) SIPOS layer 140 to the underlying material layer 120, as shown in FIG. 2(g), after which a conductive contact 180 may be formed in the contact region 170, as shown in FIG. 2(h). The conductive contact 180 may be a metal contact, e.g. an Al contact, and may be formed in any suitable manner, e.g. by depositing a metal layer over the resultant structure of FIG. 2(g) and patterning this layer to form the metal contact. Alternatively, a selective deposition process may be used.

At this point, it is emphasized that especially for application domains in which the quality of the vacuum to be established inside the cavity 150 is not of crucial importance, alternative techniques for sealing the porous SIPOS layer 140 may be considered. Such alternative techniques may include the deposition of a sealing layer over the porous SIPOS layer 140, for which any suitable sealing material may be used. Non-limiting examples of suitable sealing materials include poly-Si, oxides, nitrides and metals such as Al.

Figure 3:
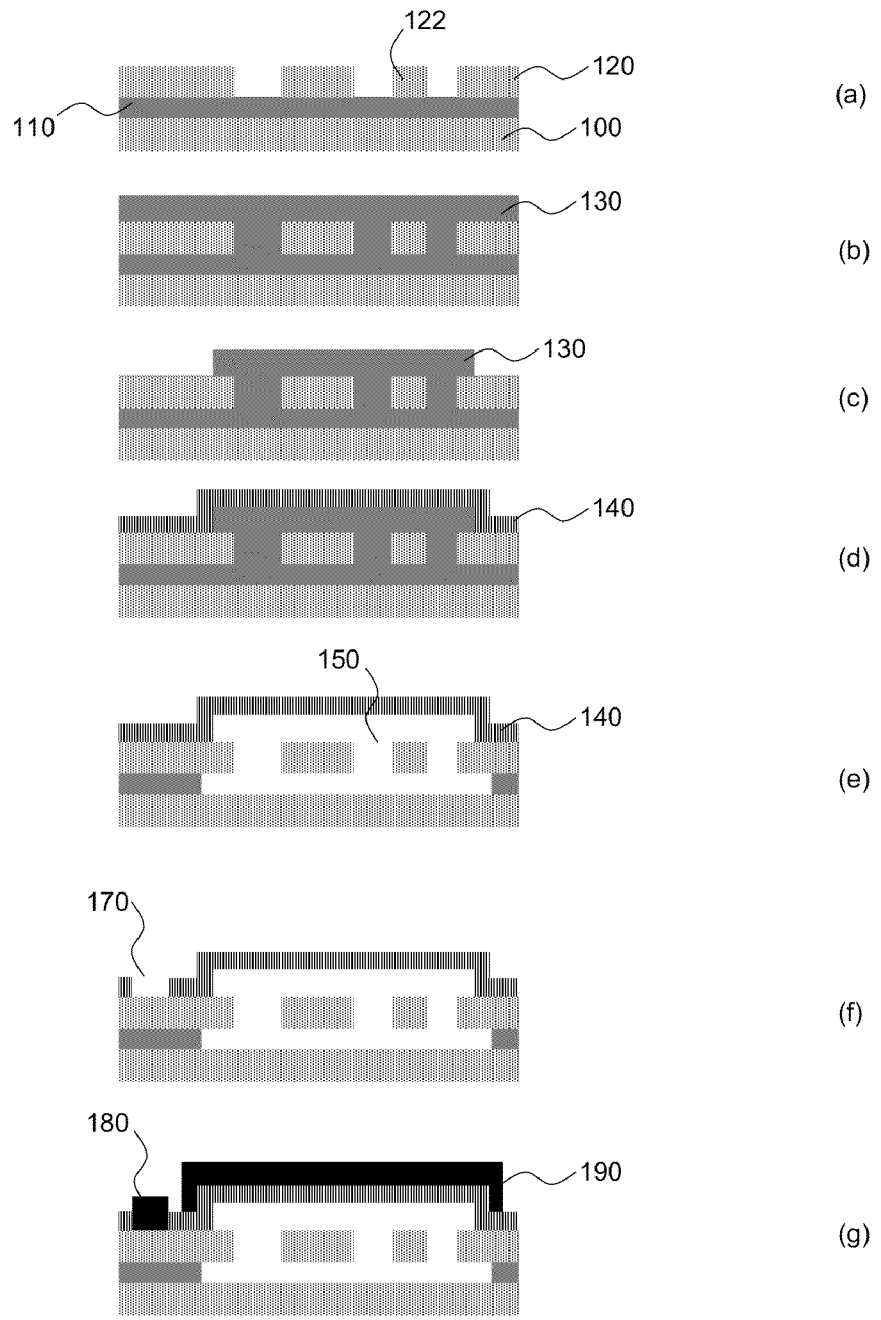
FIGS. 3a-g depict a method of manufacturing a MEMS device in accordance with another embodiment of the present invention.

FIG. 3 depicts an embodiment of the formation of a metal sealing layer over the porous SIPOS layer 140. FIG. 3(a)-(e) are identical to FIG. 2(a)-(e). In FIG. 3(f), the contact region 170 is formed in the porous SIPOS layer 140, after which a metal layer, e.g. an Al layer is deposited over the resultant structure in FIG. 3(g), which is subsequently patterned in any suitable manner to form the contact 180 and the sealing layer 190 over the porous SIPOS capping layer 140. It will be appreciated that the formation of the contact and sealing layer in a single process step reduces the number of process steps compared to the embodiment of the packaging method shown in FIG. 2, thus reducing the cost of the MEMS structure containing device. However, the drawback of this approach is that due to the fact that the metal layer is typically formed at a lower temperature compared to the thermal oxidation process, the resultant pressure in the cavity 150 is typically higher than when a thermal oxidation process is used to seal the porous SIPOS layer 140.

Figure 4:
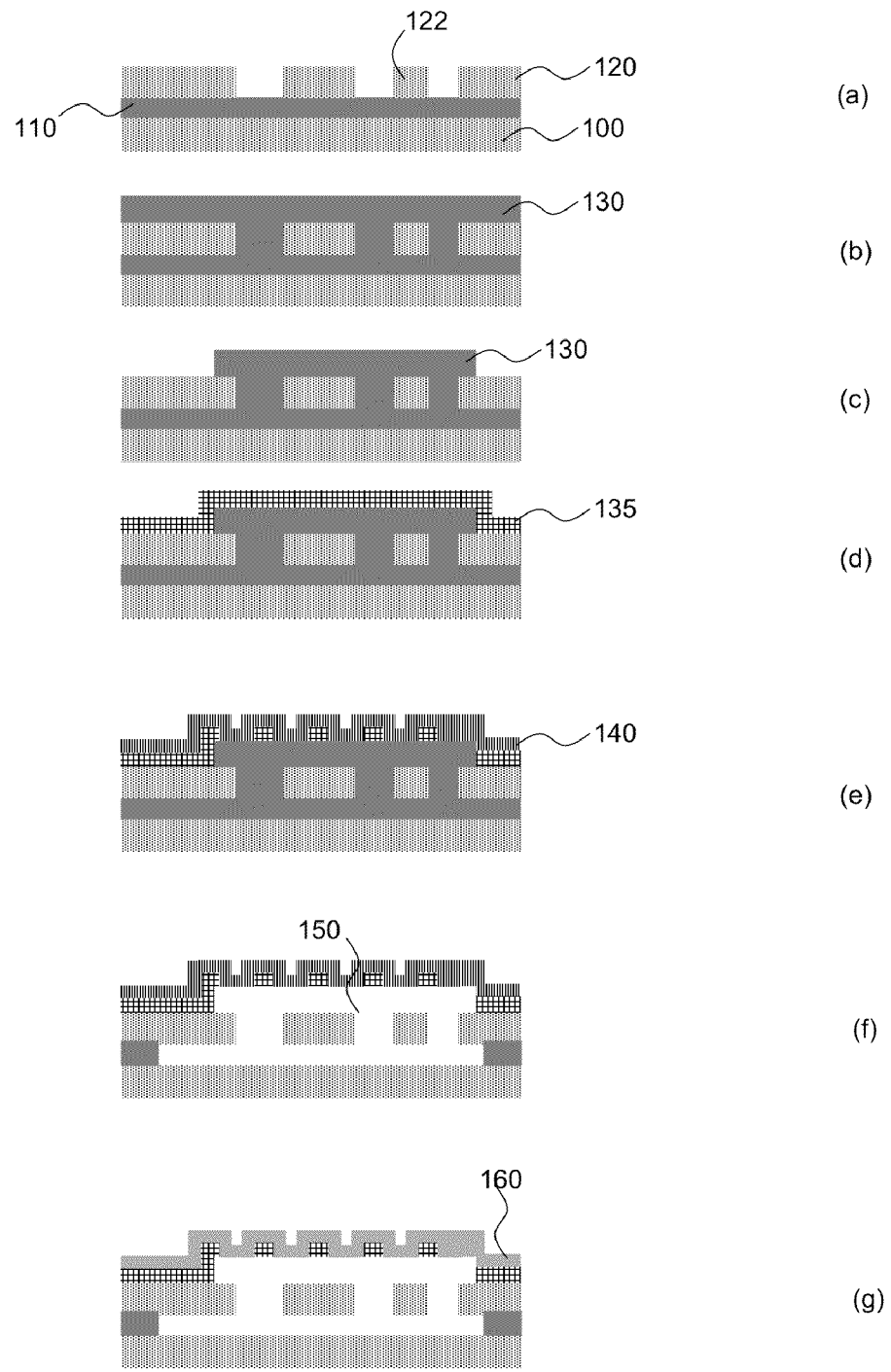
FIGS. 4a-g depict a method of manufacturing a MEMS device in accordance with another embodiment of the present invention.

In case the porous SIPOS layer 140 is to be fully oxidized to seal the cavity 120, it may be advantageous to strengthen the SIPOS layer with a support capping layer. An embodiment of such a modified method is shown in FIG. 4. FIG. 4(a)-(c) are identical to FIG. 2(a)-(c). In FIG. 4(d), a support capping layer 135 is deposited, which may be any suitable material, preferably poly-Si. This layer is subsequently patterned, e.g. through etching, after which the SIPOS layer 140 is deposited as shown in FIG. 4(e) such that the SIPOS capping layer 140 is supported by portions of the support capping layer 135, thus reinforcing the SIPOS capping layer 140.

The packaging method may continue as shown in FIG. 2, i.e. by treating the SIPOS layer 140 with a suitable etchant, e.g. HF to make this layer porous and remove the sacrificial material to form the cavity 150 as shown in FIG. 4(f), after which the SIPOS layer may be oxidized by e.g. thermal oxidation to form the oxidized SIPOS sealing layer 160 reinforced by the portions of the support capping layer 135 over the cavity 150 as shown in FIG. 4(g). Subsequent processing steps may also be present, such as the formation of the contact region as shown in FIG. 2(g) and the formation of the conductive contact in the contact region as shown in FIG. 2(h).

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of packaging a micro electro-mechanical structure comprising:
   forming said structure on a substrate;
   depositing a sacrificial layer over said structure;
   patterning the sacrificial layer;
   depositing a SIPOS (semi-insulating polycrystalline silicon) layer over the patterned sacrificial layer;
   treating the SIPOS layer with an etchant to convert the SIPOS layer into a porous SIPOS layer;
   removing the patterned sacrificial layer through the porous layer SIPOS to form a cavity including said structure; and
   sealing the porous SIPOS layer.

2. The method of claim 1, wherein the steps of treating the SIPOS layer and removing the patterned sacrificial layer are performed as a single step using the same etchant.

3. The method of claim 1, wherein the etchant is hydrogen fluoride.

4. The method of any of claim 1, further comprising:
   providing a contact region in the SIPOS layer following the removal of the patterned sacrificial layer; and
   forming a metal contact in at least said contact region.

5. The method of claim 4, wherein the metal contact is an aluminum contact.

6. The method of any of claim 1, wherein the step of sealing the porous SIPOS layer comprises at least partially converting the porous SIPOS layer into an oxide layer.

7. The method of any of claim 1, further comprising forming a patterned support layer over the sacrificial layer prior to depositing the SIPOS layer.

8. The method of any of claim 1, wherein the step of sealing the porous SIPOS layer comprises depositing a sealing layer over the porous SIPOS layer.

9. The method of claim 4, wherein the step of forming a metal contact in at least said contact region comprises depositing a metal layer over the porous SIPOS layer and patterning said metal layer to form the metal contact and a sealing layer for at least the part of said porous SIPOS layer covering the cavity.

10. A device comprising:
    a substrate covered by a porous SIPOS capping layer;
    a cavity between the substrate and the porous SIPOS capping layer, said cavity including a micro electro-mechanical structure; and
    a sealing layer covering the porous SIPOS capping layer.

11. The device of claim 10, wherein the sealing layer comprises thermally oxidized SIPOS.

12. The device of claim 10, wherein the sealing layer comprises a metal layer.

13. The device of claim 12, wherein the metal layer is aluminum.

14. The device of any of claim 10, wherein the capping layer further comprises a patterned support structure.

* * * * *